United States Patent [19]

Kassatly et al.

[11] Patent Number: 5,487,131
[45] Date of Patent: Jan. 23, 1996

[54] METHOD FOR ANALYZING THE FLOW OF DATA THROUGH A COMPLEX INFORMATION EXCHANGE SYSTEM

[75] Inventors: Amal A. Kassatly, Shrewsbury; Taylor S. Chaney, Arlington; Peter Floss, Graton, all of Mass.

[73] Assignee: Digital Equipment Corporation, Maynard, Mass.

[21] Appl. No.: 804,481

[22] Filed: Dec. 9, 1991

Related U.S. Application Data

[63] Continuation of Ser. No. 511,560, Apr. 20, 1990, abandoned.

[51] Int. Cl.$^6$ ................................................. G06F 15/18
[52] U.S. Cl. ........................... 395/62; 395/65; 395/64; 395/11; 395/800; 364/DIG. 1; 364/DIG. 2
[58] Field of Search ........................ 395/62, 65, 800, 395/64, 11; 364/200, 900, DIG. 1, DIG. 2

[56] References Cited

U.S. PATENT DOCUMENTS

| | | | |
|---|---|---|---|
| 3,891,974 | 6/1975 | Coulter et al. | 364/200 |
| 4,276,594 | 6/1981 | Morley | 395/800 |
| 4,293,855 | 10/1981 | Perkins | 340/802 |
| 4,472,770 | 9/1984 | Li | 364/148 |
| 4,525,780 | 6/1985 | Bratt et al. | 364/200 |
| 4,558,413 | 12/1985 | Schmidt et al. | 364/200 |
| 4,607,325 | 8/1986 | Horn | 364/151 |
| 4,656,582 | 4/1987 | Chaitin et al. | 364/300 |
| 4,658,359 | 4/1987 | Palatucci et al. | 364/513 |
| 4,686,649 | 8/1987 | Rush et al. | 364/200 |
| 4,752,890 | 6/1988 | Natarajan et al. | 364/300 |
| 4,754,410 | 6/1988 | Leech et al. | 364/148 |
| 4,769,772 | 9/1988 | Dwyer | 364/300 |
| 4,782,444 | 11/1988 | Munshi et al. | 364/300 |
| 4,802,091 | 1/1989 | Cocke et al. | 364/300 |
| 4,809,219 | 2/1989 | Ashford et al. | 364/900 |
| 4,831,521 | 5/1989 | Rutherford et al. | 395/775 |
| 4,841,441 | 6/1989 | Nixon et al. | 364/401 |
| 4,885,684 | 12/1989 | Austin et al. | 364/200 |
| 4,962,473 | 10/1990 | Crain | 364/900 |
| 4,965,743 | 10/1990 | Malin et al. | 364/578 |
| 4,970,658 | 11/1990 | Durbin et al. | 395/64 |
| 4,975,840 | 12/1990 | DeTore et al. | 364/513 |
| 4,979,137 | 12/1990 | Gerstenfeld et al. | 395/905 |
| 5,065,360 | 11/1991 | Kelly | 395/800 |
| 5,101,491 | 3/1992 | Katzeff | 364/DIG. 1 |
| 5,111,413 | 5/1992 | Lazansky et al. | 364/488 |

FOREIGN PATENT DOCUMENTS

| 0364189 | 4/1990 | European Pat. Off. | 6 F/15 |
|---|---|---|---|
| 90/00290 | 1/1990 | WIPO | 6 F/15 |

OTHER PUBLICATIONS

Ford, et al, "An Intelligent Modeling System for Simulating Manufacturing Processes"; Proceedings Of The 1987 Winter Simulation Conference, Dec. 1987, Atlanta, Georgia, pp. 525–529.

Prakash, et al, "Intelligent Back-End of a Goal-Directed Simulation Environment for Discrete-Part Manufacturing"; Proceedings Of The 1989 Winter Simulation Conference, Dec. 1989, Washington, D.C. pp. 883–891.

Hoyland, et al 'C-Saint, "A Simulation Modeling Tool Customized for Workload and Information Flow Analysis", IEEE 1988 National Aerospace and Electronics Conference, vol. 3, May 1988, Dayton pp. 823–830.

*Primary Examiner*—George B. Davis
*Attorney, Agent, or Firm*—Kenyon & Kenyon

[57] ABSTRACT

The analysis of complex data interdependencies is achieved through the application of inference methods and heuristics to dynamic models of complex information exchange systems. Through the emulation of data flows, realistic models of information exchange systems are constructed by combining both process and data flows. Data usage and concurrent data paths are monitored and analyzed through simulation of the model to improve data flows by determining alternate data paths to reduce processing time and by detecting unnecessary data paths thereby optimizing the performance of information exchange systems.

10 Claims, 13 Drawing Sheets

LOGIC SIMULATION

```
(-> 'step-distribution' instantiate
    :name 'logic-simulation-dist
    :values '(1 20 125)
    :proportions ' (0.25 0.5 0.25)
    :random-stream * random-stream-0 * )

(defschema logic-simulation .
    (is-a composite-enabling-state-process-object
          composite-process-receive-process-object
          write-info-process-object
          default-process-object)
    (duration-distribution logic-simulation-dist)
    (next-processes designer)
    (message-types good-simulation)
    (process-receive-possible-messages design-name.sav)
    (process-receive-possible-processes default-process-object)
    (process-receive-argument slots next-processes)
    (forward-slots unique-id board-complexity dec-number design-number))
```

FIG. 3A

SCHEMATIC CAPTURE

```
(-> 'step-distribution' instantiate
      :name 'schematic-capture-distribution
      :values '(5 10 15)
      :proportions '(0.25 0.5 0.25)
      :random-stream * random-stream-0 *

(defschema schematic-capture
      (is-a composite-enabling-state-process-object
            composite-activate-time-process-object
            composite-send-process-object
            write-info-process-object
            default-process-object)
      (duration-distribution schematic-capture-distribution)
      (next-processes (soft-tools))
      (message-types (plotted-paper-schematic))
      (enabling-state-possible-messages valid-files-tape)
      (enabling-state-possible-processes default-process-object)
      (activate-time-possible-messages valid-files-tape)
      (activate-time-possible-processes dependency-activate-time-process-
       object)
      (activate-time-dependency-slot board-complexity)
      (activate-time-dependency-factor 3.0)
      (send-possible-messages files-tape)
      (send-possible-processes default-process-object)
     (send-argument-slots next-processes message-types)
     (forward-slots unique-id board-complexity dec-number design-number))
```

FIG. 3B

SOFT TOOLS

```
(-> 'constant-distribution' instantiate
    :name 'soft-tools-dist
    :constant 1.0
    :random-stream * random-stream-0 * )

(defschema soft-tools
    (is-a write-info-process-object
        composite-send-process-object
        default-process-object)
    (duration-distribution soft-tools-dist)
    (message-types artwork-files
                    on-line-drill-tools
                    on-line-route-tools)
    (next-processes manufacturing-machine)
    (forward-slots unique-id board-complexity dec-number design-number
                    layout-system ) )
```

FIG. 3C

MANUFACTURING MACHINE

```
(-> 'constant-distribution' instantiate
    :name 'manufacturing-machine-dist
    :constant 1.0
    :random-stream * random-stream-0 * )

(defschema manufacturing-machine
    (is-a composite-enabling-state-process-object
        terminate-message-process-object
        write-info-process-object
        default-process-object)
    (duration-distribution manufacturing-machine-dist)
    (enabling-state-possible-processes
                match-messages-process-object
                match-messages-process-object
                match-messages-process-object )
    (enabling-state-possible-messages
                artwork-files
                on-line-drill-tools
                on-line-route-tools )
    (match-message-types artwork-files
                on-line-drill-tools
                on-line-route-tools ) )
```

FIG. 3D

MESSAGE OBJECTS

```
(defschema design-name.sav
    (is-a message-object)
    (type design-name.sav)
    (category part logic-connectivity)
    (file-list)
    (desc " ")
    (board-complexity) (dec-number) (design-number) (unique-id))

(defschema files-tape
    (is-a message-object)
    (type files-tape)
    (category non-file)
    (desc " All valid files")
    (board-complexity)
    (dec-number) (design-number)
    (unique-id))

(defschema good-simulation
    (is-a message-object)
    (type good-simulation)
    (category unknown)
    (desc " ")
    (board-complexity)
    (dec-number) (design-number)
    (unique-id) (layout-system))

(defschema plotted-paper-schematic
    (is-a message-object)
    (type plotted-paper-schematic)
    (category non-file part logical-connectivity)
    (desc " ")
    (board-complexity)
    (dec-number) (design-number) (unique-id))

(defschema work-order-number
    (pdq-number)
    (work-order-number))
```

FIG. 4A

```
(defschema artwork-files
    (is-a message-object)
    (type artwork-files)
    (category artwork)
    (files artjob.log artbat.log artjob.com artjob.opi bfdjob.opi
        artpos.asg artwrk.wln artwrk.sig artwhl.rpt arttls.sum
        axxgbd.nn artt0.sum )
    (desc "ARTPost log file
        ARTPost batch procedure log file
        ARTPost command file
        ARTPost operator input file
        ARTPost BFD plot operator input file
        ARTPost assignment file
        ARTPost wheel description file
        ARTPost BFD signature file
        ARTPost wheel description summary report
        ARTPost tools summary file
        ARTPost output multiplot files note 1
        ARTTools file summary report " )
    (board-complexity ) (dec-number )
    (design-number ) (unique-id ))

(defschema on-line-drill-tools
    (is-a message-object)
    (type on-line-drill-tools)
    (category drilling)
    (files drlpos.asg arltls.asg arljob.com drljob.opi drljob.log
        pid/rev.d pid/rev.m pid/rev.1
        pid/rev_h.plo drtls.sum drlt01.sum )
    (desc "")
    (board-complexity) (dec-number)
    (design-number) (unique-id ))

(defschema on-line-route-tools
    (is-a message-object)
    (type on-line-route-tools)
    (category routing )
    (desc "")
    (board-complexity) (dec-number)
    (design-number) (unique-id ) )
```

FIG. 4B

{ { DESIGN-NAME.SAV-2
    INSTANCE: DESIGN-NAME.SAV
    TIME: 1.0
    SENDER: DESIGN-ENGINEER
    RECEIVER: LOGIC-SIMULATION
    CATEGORY: PART LOGIC-CONNECTIVITY
    UNIQUE-ID: UNIQUE-ID-1
    BOARD-COMPLEXITY: 1
    DEC-NUMBER: DEC-NUMBER-1
    DESIGN-NUMBER: DESIGN-NUMBER-1 } }

{ { GOOD-SIMULATION-3
    INSTANCE: GOOD-SIMULATION
    TIME: 21.0
    SENDER: LOGIC-SIMULATION
    RECEIVER: DESIGN-ENGINEER
    CATEGORY: ARTWORK PARTS
    UNIQUE-ID: UNIQUE-ID-1
    BOARD-COMPLEXITY: 1
    DEC-NUMBER: DEC-NUMBER-1
    DESIGN-NUMBER: DESIGN-NUMBER-1 } }

{ { ARTWORK-FILES-6
    INSTANCE: ARTWORK-FILES
    TIME: 78.0
    SENDER: SOFT-TOOLS
    RECEIVER: MANUFACTURING-MACHINE
    CATEGORY: ARTWORK
    DESC : "ARTPost log file
        ARTPost batch procedure log file
        ARTPost command file
        ARTPost operator input file
        ARTPost BFD plot operator input file
        ARTPost assignment file
        ARTPost wheel description file
        ARTPost BFD signature file
        ARTPost wheel description summary report

FIG. 6A-1

ARTPost tools summary file
ARTPost output multiplot files note 1
ARTTools file summary report
    UNIQUE-ID: UNIQUE-ID-1
    BOARD-COMPLEXITY: 1
    DEC-NUMBER: DEC-NUMBER-1
    DESIGN-NUMBER: DESIGN-NUMBER-1 } }

{ { VALID-FILES-TAPE-12
    INSTANCE: VALID-FILES-TAPE
    TIME: 22.0
    SENDER: DESIGN-ENGINEER
    RECEIVER: SCHEMATIC-CAPTURE
    CATEGORY: PARTS LOGIC-CONNECTIVITY
    UNIQUE-ID: UNIQUE-ID-1
    BOARD-COMPLEXITY: 1
    DEC-NUMBER: DEC-NUMBER-1
    DESIGN-NUMBER: DESIGN-NUMBER-1 } }

FIG. 6A-2

{ { PLOTTED-PAPER-SCHEMATIC-13
    INSTANCE: PLOTTED-PAPER-SCHEMATIC
    TIME: 67.0
    SENDER: SCHEMATIC CAPTURE
    RECEIVER: SOFT-TOOLS
    CATEGORY: PART LOGIC-CONNECTIVITY
    UNIQUE-ID: UNIQUE-ID-1
    BOARD-COMPLEXITY: 1
    DEC-NUMBER: DEC-NUMBER-1
    DESIGN-NUMBER: DESIGN-NUMBER-1 } }

{ { ON-LINE-DRILL-TOOLS-14
    INSTANCE: ON-LINE-DRILL-TOOLS
    TIME: 78.0
    SENDER: SOFT-TOOLS
    RECEIVER: MANUFACTURING-MACHINE
    CATEGORY: DRILLING ARTWORK
    FILES: drlpos.asg arltls.asg arljob.com drljob.opi drljob.log
          pid/rev.d pid/rev.m pid/rev.1
          pid/rev_h.plo drtls.sum drlt01.sum
    UNIQUE-ID: UNIQUE-ID-1
    BOARD-COMPLEXITY: 1
    DEC-NUMBER: DEC-NUMBER-1
    DESIGN-NUMBER: DESIGN-NUMBER-1 } }

{ { ON-LINE-ROUTE-TOOLS-15
    INSTANCE: ON-LINE-ROUTE-TOOLS
    TIME: 78.0
    SENDER: SOFT-TOOLS
    RECEIVER: MANUFACTURING-MACHINE
    CATEGORY: ROUTING PARTS
    UNIQUE-ID: UNIQUE-ID-1
    BOARD-COMPLEXITY: 1
    DEC-NUMBER: DEC-NUMBER-1
    DESIGN-NUMBER: DESIGN-NUMBER-1 } }

FIG. 6B

{ { data-category ^schema-name parts-1
        ^data-category parts
        ^usage-slot used
        ^time-used 50 } }

{ { data-category ^schema-name test-1
        ^data-category test
        ^usage-slot modified
        ^time-used 50 } }

{ { data-category ^schema-name connectivity-1
        ^data-category connectivity
        ^usage-slot nil
        ^time-used 50 } }

{ { data-category ^schema-name test-points-1
        ^data-category test-points
        ^usage-slot created
        ^time-used 50 } }

FIG. 7

METHOD FOR ANALYZING THE FLOW OF DATA THROUGH A COMPLEX INFORMATION EXCHANGE SYSTEM

This application is a continuation of application Ser. No. 07/511,560, filed Apr. 20, 1990, now abandoned.

FIELD OF THE INVENTION

This invention relates to an artificial intelligence system, and more particularly, to an artificial intelligence system that utilizes modeling simulation and rule-based inference to analyze complex dynamic data paths.

BACKGROUND OF THE INVENTION

In any corporate environment, the flow of information between different entities within the corporation plays a crucial role in corporate performance. The larger the organization becomes, the more complex the information transfer network becomes. The larger the information transfer network becomes, the more susceptible it becomes to poor resource allocation. For example, information handled by one entity may also be handled concurrently by another entity thereby producing redundant results. Also, information generated by one entity may no longer be needed by other entities in the corporation thereby wasting valuable resources. Such a scenario results in suboptimal information flow between two communicating entities.

One solution proposed to overcome this inefficient mode of information flow is to manually track the information flow within an organization. This solution can be implemented by employing a number of management consultants whose tasks would be, among others, to identify information paths, the different entities involved and the information required and generated by each entity. The initial characterization of the system is one of the areas that renders the analysis of an information exchange cumbersome as the systems become more complex. To perform an accurate and useful analysis, a global knowledge base must be built from each individual knowledge base within the information exchange. The next step is to analyze this information to identify areas where performance degradation occurs and suggest alternative methods for transferring information or performing certain tasks.

While such a solution may be viable for a small information exchange, as the organizations grow and the information exchange becomes more and more complex, such an approach becomes inadequate. In particular, there is a need to optimize the flow of information where there are numerous entities involved in a complex information exchange. Thus, it is imperative to identify and modify suboptimal information flow to improve performance.

SUMMARY OF THE INVENTION

Accordingly, the present invention provides for the analysis of complex data interdependencies through the application of inference methods and heuristics to dynamic models of complex information exchange systems. Through the simulation and emulation of data flows, the invention constructs realistic models of an information exchange system by combining both process and data flows. Through the simulation of the model, the present invention monitors and analyzes data usage, evaluates concurrent data paths and suggests alternate data paths to reduce processing time thereby optimizing system performance. In addition, the present invention suggests the elimination of certain tasks which create data that is not used by others in the information exchange.

Generally, the present invention comprises an artificial intelligence (hereinafter "AI") computer system. This system comprises a central processing unit, memory and a user interface. The central processing unit comprises a simulation clock, an agenda mechanism to order events on the simulation clock and a rule interpreter.

The present invention develops detailed models of existing or proposed complex systems using AI modeling technology combined with traditional simulation techniques. These models are simulated to function as the real world systems being simulated. To accomplish this, messages transferred within a model comprise real data. Furthermore, the model is operated to emulate the actual functions of the system being simulated. By performing this simulation, paths of data element flows are generated. Opportunities to optimize system performance are identified using rule-based inference to identify concurrent data element paths or unused data elements.

The rules can be written in any rule-based language. The rules perform different operations on the data collected during the simulation. The rules include a premise, i.e., a conditional statement, and a conclusion, i.e., the action to take if the condition is satisfied.

Through the use of rule-based inference, suboptimal data paths and unused data elements are identified as follows. The invention first develops a detailed simulation model of the complex information exchange system. The simulation model is executed to provide information about the paths of data element flow. The information collected for each data element includes the processes at which each data element is created, referenced, modified, ignored and deleted and the time that such action occurs. Through the use of rule-based inference, the present invention identifies and recommends modification to suboptimal data element paths based upon the information collected during execution. To accomplish this, the system tries to find instances that match the premise of the rules among the data collected by the simulation. If such instances are found, the conclusion part of the rule is carried out to propose alternative paths or indicate unused data elements for optimizing performance.

BRIEF DESCRIPTION OF THE DRAWINGS

FIGS. 3A, 3B, 3C and 3D enumerate program instructions for modeling the information exchange system of FIG. 1.

FIGS. 4A and 4B enumerate the message objects utilized when the information exchange system of FIG. 1 is simulated.

FIGS. 6A and 6B enumerate the database of working memory elements created when the model of the information exchange system of FIG. 1 is simulated.

FIG. 7 enumerates the database of working memory elements created upon execution of the set-up production rule for rule 4.

DETAILED DESCRIPTION

Figure 1:
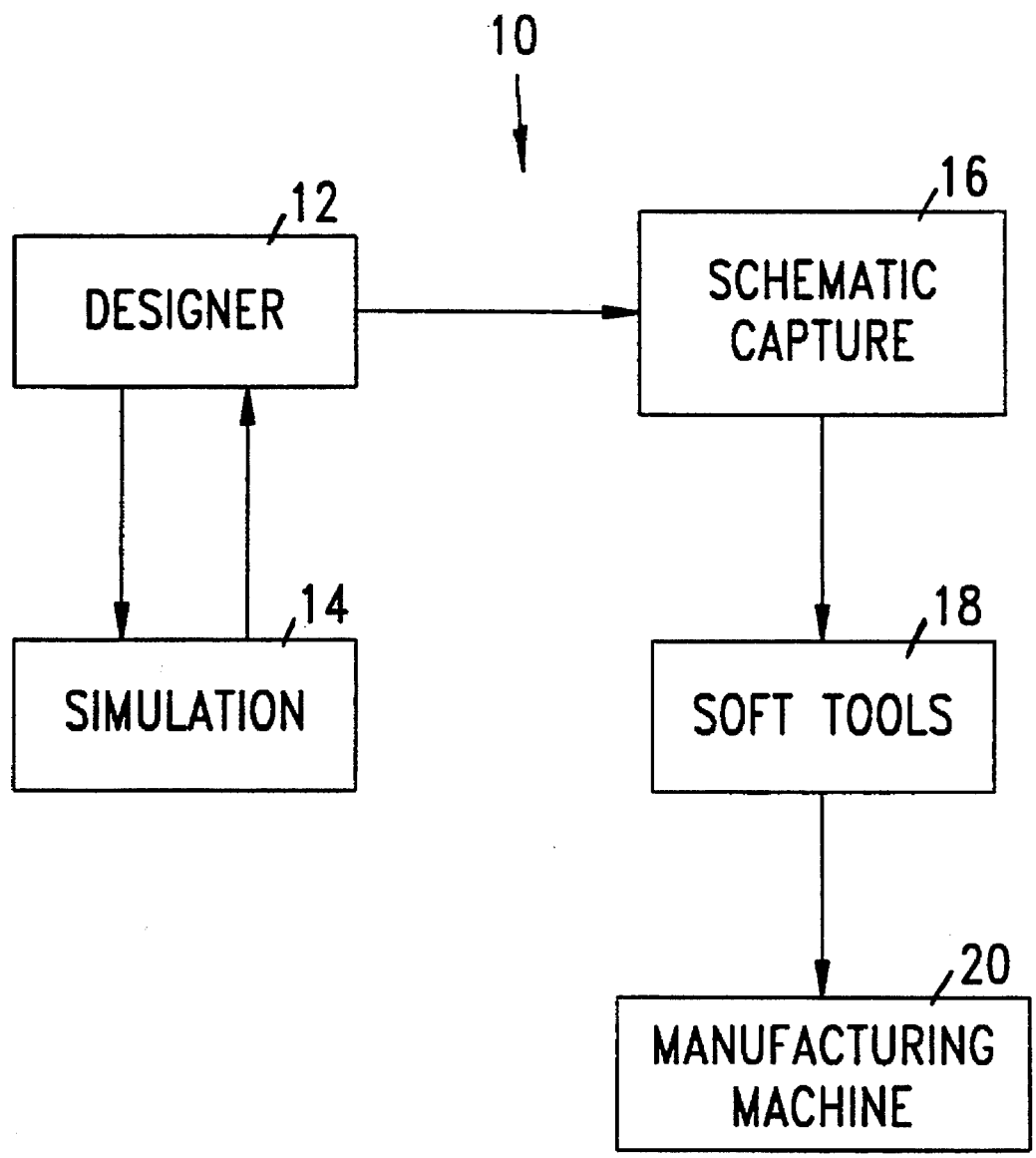
FIG. 1 is an illustration of an information exchange system.

Referring now to the drawings, and initially to FIG. 1, there is illustrated, in block diagram form, an information exchange system 10 to which the present invention can be applied. The system 10 depicts the major elements in a new product cycle for an engineering design, development and manufacturing operation.

The major elements of system 10 are a designer 12, a simulation tool 14, a schematic capture tool 16, a soft tool generator (hereinafter "soft tools") 18 and a manufacturing machine 20. Each element represents the individual or individuals either responsible for the task or responsible for the tool that performs the task. Designer 12 represents an engineer or group of engineers responsible for creating a new design, e.g., an I/O controller circuit board for use in a computer. Simulation tool 14 is utilized by designer 12 to simulate the new design to verify its performance. As shown, the information flow between designer 12 and simulation tool 14 is bidirectional. This enables designer 12 to perform a number of simulation iterations. Schematic capture tool 16 is utilized to develop a layout for the printed circuit board of the new design when the design is complete. Soft tools 18 generates software to control manufacturing machine 20 which could be an integrated circuit chip insertion machine. The software generated by soft tools 18 provides the instructions for manufacturing machine 20.

Each of the elements of FIG. 1 represents the "work steps" required to take a new design for a circuit board from the conceptual stage to the manufacturing stage. The information input to system 10 is an idea for a new design, the output is the chip insertion instructions to manufacturing machine 20. There is a large amount of information exchanged within each work step and between the work steps to convert a conceptual design to a manufactured product. This information exchange system 10 is a large complex system that has numerous interdependencies not readily ascertainable. For example, while each individual responsible for a particular work step is fully aware of the tasks he performs and the information he receives, creates or passes to other work steps, he most likely is unaware of the tasks performed and information required by other work steps.

To analyze the information flow in system 10 of FIG. 1, the present invention develops a realistic model of the information exchange. Each work step of the model is patterned after the real world function the work step performs. Through the emulation of data flows in the model, the present invention is able to observe the dynamics and interdependencies between processes in the complex network of information exchange system 10 in a global manner.

To construct an accurate model for information exchange system 10, information must be gathered from the participants in the exchange to first identify the work steps and then to identify the information that flows into and out of the work steps to accomplish its tasks. For example, the inputs, outputs, behaviors and time duration of events occurring must be ascertained for each work step. The number of works steps identified depends upon the level of representation chosen for the model of the real world processes and the domain being modeled.

The model of information exchange system 10 is created by dividing the exchange process into discrete events. Each event is examined to determine the preconditions for the event to take place. Examples of preconditions are the type of information required to start the event, the amount of time required to perform the event as well as the outputs of the event. It is possible that the outputs from one event may meet the preconditions of the next discrete event.

The above inquiry is repeated by following the information exchange being modeled from work step to work step. Thus, an event network which is an accurate characterization of the information exchange is developed. The complete event network is utilized to develop a model that has identified all events, the preconditions of each event, the information flow between events and accomplishes the overall process goal of system 10 to transform a design into instructions for manufacturing machine 20.

The modeling design methodology of the present invention is based upon the principles of object-oriented programming. This methodology includes message-passing, hiearchical inheritance, encapsulation and modularity as will be explained below.

Real world functions and operations are represented by processes to implement a model of system 10. All processes have "durations", i.e., an amount of time required to perform data transformations, associated with them. Furthermore, a process may be decomposed into subprocesses. Processes may also require external resources to begin processing. Messages are used to represent information and/or data communicated between functions. Typically, a process receives one or more messages, performs a data transformation on the messages received and/or local knowledge maintained by the process, and then sends out some number of messages.

In the model, processes, messages and resources are all represented as objects. In an object-oriented programming environment, objects are program entities which map to real world entities and concepts. The objects contain both data and procedures that describe their characteristics and behavior. Data is stored in an object in attribute-value pairs. The name of each attribute is called a slot. Objects interact through message-passing which causes one of the receiving objects' procedures to be executed. Furthermore, objects inherit data and procedures from other objects within a hierarchy.

Figure 2:
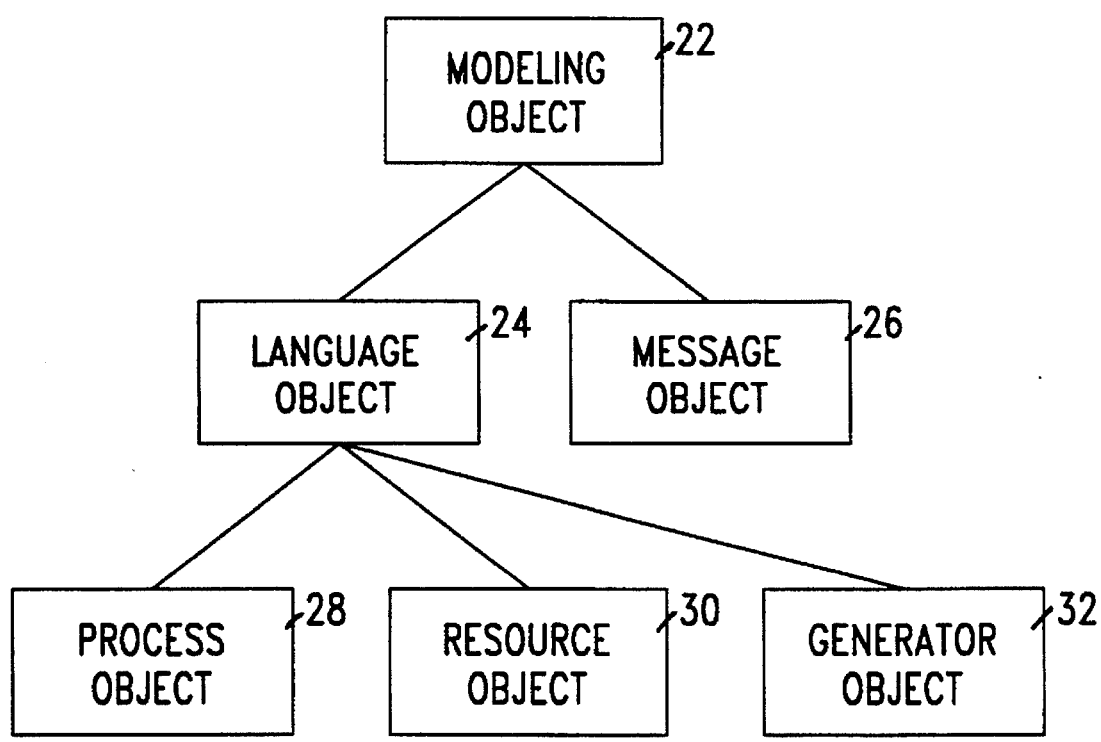
FIG. 2 is an illustration of the hierarchy of the modeling language.

The modeling language used in the present invention consists of a set of objects that form the basic modeling constructs. Referring now to FIG. 2, there is illustrated, the hierarchy of the modeling language. The root of the modeling language is a modeling object 22. Below the root, the language comprises a process-object 28, a message-object 26, a resource-object 30 and a generator-object 32. These high level objects contain the default data and procedures that all lower level objects inherit. These default values may be overridden through inheritance and/or customization to achieve the desired behavior. The modeling language primitives are implemented in Knowledge Craft™ language which is a hybrid AI programming environment and is a commercially available product marketed by Carnegie Group, Inc. The specific objects developed to model system 10 would branch from the high level objects shown in FIG. 2.

Process object 28 is used to represent real world functions or processes. Process-object 28 has three basic procedures it performs. These procedures are: (1) receiving messages from other processes, (2) performing data transformations on the messages, and (3) sending messages to processes. Process-object 28 requires a considerable amount of local knowledge to perform these procedures. As with real world functions, these process objects contain both data and procedures, require resources and have time durations.

Generator-object 32 is a specialized process object that represents a point of entry for information and data created external to system 10. Whereas most process objects are triggered by messages received, generator process objects are triggered by predefined parameters. Generator-object 32 creates initial messages with initial slot values that enter the model at a specific frequency. The send procedure of generator-object 32 is similar to the corresponding portion within process-object 28. The frequency with which the initial messages are sent and limits on when to stop sending messages are specified in generator-object 32.

Message-object 26 represents information and/or data communicated with the system being modeled, i.e., system 10. It differs from the other modeling objects within the language in that it contains data, i.e., slots and values, but not procedures. The data within message-object 26 is typically created within generator-object 32 and transformed within process object 28 and other subsequent processes.

The limited availability of resources is represented through resource-object 30. The quantity of a resource available is specified within resource-object 30 while the quantity of a resource required by a process is specified within process-object 28. If the quantity of a resource required by a process is unavailable, the process will be required to wait for the resource. Several different processes may contend for the same resource.

From the high level hierarchy of the modeling language, a model is constructed by building a knowledge-based AI representation of information exchange system 10 to characterize the information flow. AI representation allows modeling of the real world work steps in a computer system and accommodates reasoning about the AI knowledge base constructed. Building a model consists of specializing the generalized modeling primitives to customize the behavior of the objects. The hierarchical architecture of the modeling language allows complex behavior to be developed incrementally. The model comprises a number of objects that represent the processes performed by each work step. The objects emulate the work steps by transmitting and receiving data in a manner very similar to data transfer operations of system 10 in a real world environment. The knowledge base comprises a plurality of data structures referred to as "frames". The frames contain the various attributes of the work step being emulated by the model such as a list of the files the work step receives, any required preconditions, the duration of processing, what files are transmitted after processing and to whom are the files transmitted. The frames are also utilized to store information which represents messages transmitted between work steps.

The programming language (or "code") for building a model of the event network embodied in system 10 is set forth below and in FIGS. 3A–3D. These customized objects are constructed to simulate the behavior of the discrete events that occur in system 10.

The customized generator object provides the initial external event that starts the processing in the event network, i.e., a designer entering the design into the first process.

The first section of code which defines the generator object for the model of system 10 is set forth below. Both the generator object and the process objects of the model of system 10 require this section of code in varying form as is discussed below.

```
(-> 'constant-distribution 'instantiate
    :name 'generate-distribution
    :constant 1.0
    :random-stream *random-stream-0*)
```

The foregoing section of code declares a distribution. A distribution is a statistical estimate of the time consumed by a work step from activation to completion. This definition is applicable to process objects in general. Generator objects, however, are specialized process objects that are not activated by an input message. Generator objects are activated in the present invention by a simulation clock. Thus, the distribution above defines the generator object to be activated at one clock unit time.

Set forth below is the code which defines the behavior of the generator object. Each line of code is essentially a slot which attributes certain characteristics to the object.

```
(defschema generator                                        (1)
    (instance initial-generator-object                      (2)
              evaluate-slots-generator-object               (3)
              forward-slot-values-process-object            (4)
              default-generator-object)                     (5)
(generate-count-limit 1)                                    (6)
(next-generate-distribution generate-distribution)          (7)
(next-processes design-engineer)                            (8)
(message-types work-order-number)                           (9)
(evaluate-slots dec-number                                 (10)
                design-number                              (11)
                unique-id)                                 (12)
(forward-slots unique-id dec-number design-number          (13)
 board complexity))
```

The lines (1)–(2) define this process as a general purpose generator object. Lines (3)–(4) define initial data and values that are included in the output message passed by the generator object. Line (5) provides for the specified generator object to inherit the default behaviors of a generator object. Line (6) sets the maximum number of messages to be created by this generator object per simulation to be one. Line (7) defines the time interval for generating output messages by referring to "generate-distribution" as specified in the distribution section of the code. Lines (8)–(9) designate the process, i.e., "design-engineer" that receives the generator object's output message and the type of message, i.e., work-order-number, transmitted, respectively. Lines (10)–(13) define data for the output message and the structure of the output message itself.

The generator object set forth above provides stimulus to the process objects which represent the work steps of system 10. The work steps modeled in the present invention as customized process objects are design engineer 12, simulation tool 14, schematic capture 16, soft tools 18 and manufacturing machine 20. The software implementation of these process objects is shown below and in FIGS. 3A–3D.

The work step that is responsible for commencing the information exchange in system 10 is design engineer 12. The software for the process object representing design engineer 12 in the model of system 10 is illustrated below. Set forth below is the code for the distribution declaration of this process object.

```
(-> 'constant-distribution 'instantiate
    :name 'design-engineer-distribution
    :constant 1.0
    :random-stream *random-stream-0*)
```

The foregoing code names and defines a duration for the design-engineer process object. The duration specified above is identical to that specified for the generator object except that "constant 1.0" refers to the statistical estimate of the time consumed, i.e., one clock unit, for the work step represented by this process object from activation to completion. The name specified, 'design-engineer-distribution, enables the process objects to specify the duration distribution to be used.

Set forth below is a portion of the code which defines the behavior of the design-engineer process object. It is very similar to the code which defined the generator object.

```
(defschema design-engineer                                  (1)
    (is-a composite-enabling-state-process-object           (2)
          composite-process-receive-process-object          (3)
```

```
     composite-message-receive-process-object            (4)
     composite-instantiate-message-process-object        (5)
     default-process-object)                             (6)
(class design-engineer)                                  (7)
  (duration-distribution design-engineer-distribution)   (8)
  (next-processes (logic-simulation) (schematic-capture)) (9)
  (message-types (design-name.sav) (valid-files-tape))  (10)
```

Line (1) declares that this code is defining a standard process object named design-engineer. Lines (2)–(5) allow process objects to be defined that have more than one behavior that is controlled by the type and contents of messages received. Thus, the process object may generate one or more output messages depending on the input message. Line (6) allows this process object to inherit standard process object function such as receiving, activating and sending messages. Line (7) allows for the grouping of several process objects that relate to a single function for later analysis. Line (8) is a call to the duration defined in the distribution declaration each time this process executes in the event network. Line (9) defines the process, i.e., logic simulation and schematic capture, that represents the next events. Line (10) defines the message types sent by this process object.

The remainder of the code which defines the behavior of the design-engineer process object is set forth below.

Set forth below is the software implementation of an exemplary message object. Refer to FIG. 4. for other message objects utilized in the model of system 10.

```
(defschema design-name.sav                        (1)
    (is-a message-object)                         (2)
    (type design-name.sav)                        (3)
    (category part logic-connectivity)            (4)
    (file-list)                                   (5)
    (desc " ")                                    (6)
    (board-complexity) (dec-number) (design-      (7)
    number) (unique-id))
```

Lines (1)–(2) define this object as a general message. Line (3) assigns a unique name to this message type. Line (4) identifies the message by associating with it a category of information. The category information is used to analyze the information generated and used at the different process steps. Lines (5)–(7) declare the contents of the message itself.

Once system 10 has been modeled as described above, it can be simulated to collect data on the information exchange within system 10.

Figure 5:
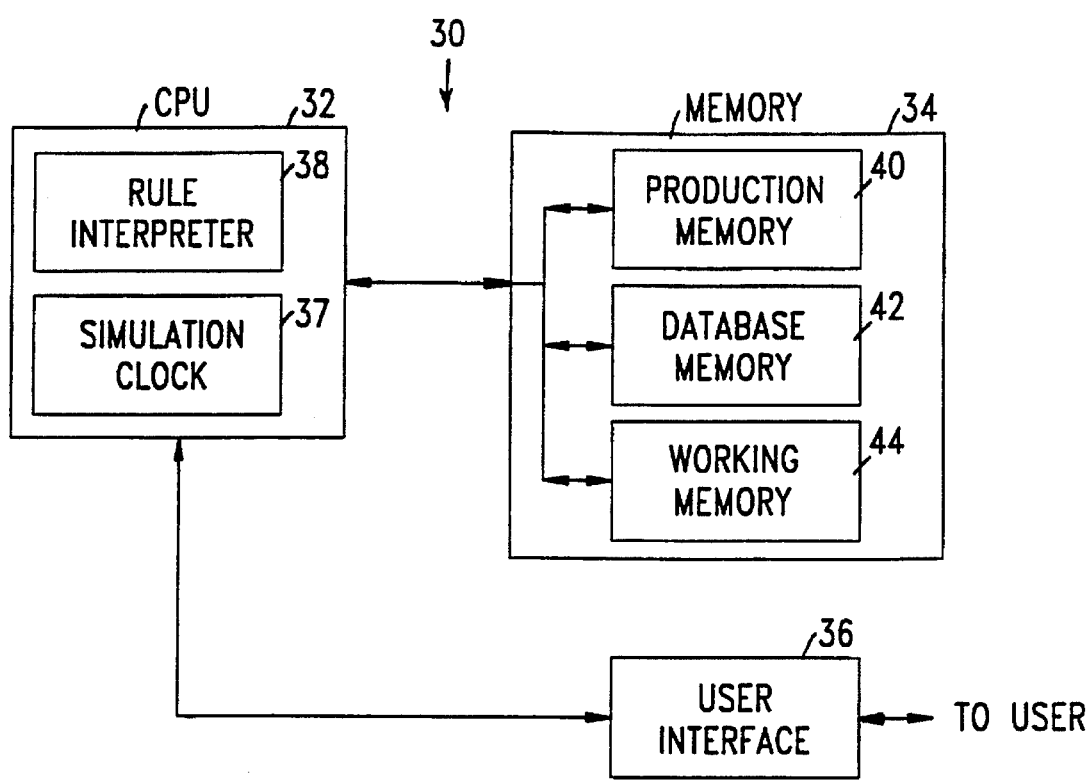
FIG. 5 is a block diagram of a computer system embodying the present invention.

Referring now to FIG. 5, there is illustrated a computer system 30 that performs the simulation and analysis of the information flows within information exchange system 10.

```
(enabling-state-possible-messages work-order-number good-simulation)        (1)
(enabling-state-possible-processes                                          (2)
        default-process-object                                              (3)
        default-process-object)                                             (4)
(process-receive-possible-messages work-order-number                        (5)
                                   good-simulation)                         (6)
(process-receive-possible-processes default-process-object                  (7)
                                   default-process-object)                  (8)
(process-receive-argument-slots next-processes)                             (9)
(message-receive-possible-messages work-order-number                       (10)
                                   good-simulation)                        (11)
(message-receive-possible-processes default-process-object                 (12)
                                   default-process-object)                 (13)
(message-receive-argument-slots message-types)                             (14)
(instantiate-message-possible-messages work-order-number                   (15)
                                   good-simulation)                        (16)
(instantiate-message-possible-processes write-info-process-object          (17)
                                   write-info-process-object)              (18)
(instantiate-message-argument-slots forward-slots)                         (19)
(forward-slots(unique-id board-complexity dec-number design-number)        (20)
(unique-id board-complexity dec-number design-number))                     (21)
```

Lines (1)–(4) define the stimulus that will activate the design-engineer process object. This activation logic is the key to giving "behavior" to the process object. The behavior of a process object is essentially defined by its specific role in the event network. Lines (5)–(9) define the next process in the event network. This code sets forth the rules for determining which one of the eligible processes is selected. Lines (10)–(14) determine the message type for the next process in the event network by providing the rules for selecting among the eligible messages. Lines (15)–(21) determine the appropriate data to be included in the next message generated.

The foregoing code provides the logic for defining the design-engineer process object. The code defined the process object, declared the input and output messages and the logic for processing messages. The software implementation for the remaining process objects performs similar functions for each process object so that the entire event network is modeled.

Computer system 30 comprises a central processing unit (hereinafter "CPU") 32, memory 34, and a user interface 36. CPU 32 comprises the simulation clock 37 and a rule interpreter 38 that determines how, when and which rules to apply. Memory 34 comprises production memory 40, database memory 42 and working memory 44. The rules are stored in production memory 40. Database memory 42 is where the results of the simulation are stored. Working memory 44 is where the results of the analysis are stored. Rule interpreter 38 attempts to execute the rules by searching database memory 42 in an attempt to locate data that satisfies the preconditions of the rules. The location operation performed by rule interpreter 38 essentially involves pattern matching where the values in database memory 42 are matched against the conditions comprising the rules.

As set forth above, database memory 42 comprises the plurality of frames containing the messages that were created through the simulation of the model of information exchange system 10. Each frame has a number of data elements that may or may not be modified by each work step that receives or transmits the message stored in the frame.

The data flows are emulated through a simulation of the model once the model is developed and the knowledge base is complete. The simulation is controlled by the simulation clock 37 which orders the activities and triggers events in the event network. The model, through simulation clock 37, is run to create an event network with events occurring at specific times. For example, each activity has a specific time in which it is to be activated. The simulation clock sequences through the activities to trigger each one at the proper time. If multiple activities are to be performed at the same clock time, the model emulates concurrent processing.

The processing of each activity through the information network results in a message per activity being generated after each event is processed. These messages are passed to the next work step in information exchange system 10 model. The messages are also time-stamped and stored in a plurality of frames as working memory elements in database memory 42. These frames comprise the information flows through information exchange system 10. The information included in the frames comprise what work step created the message, what work step transmitted it and received it, what were the contents of the message, at what time was the message sent, and whether or not this message is on a critical path, i.e., a path that takes the longest time to get information from one work step to the next work step.

This information is the database upon which the analysis of information exchange system 10 is based.

The following describes the execution sequence of the model by computer system 30. Initially, the generator object kicks off the simulation by transmitting a work-order-number message to the design-engineer process. Upon receiving this message, the design-engineer process creates a design-name.sav message which contains a pointer to the files required to simulate the design. This message is then passed to logic-simulation process.

The logic-simulation process performs a simulation of the circuit board design until the simulation results in an accurate design. A good-simulation message is transmitted to the design-engineer process when the board simulation is successfully concluded.

Upon receiving this message, the design-engineer process transmits a file-tapes message to the schematic capture process which is responsible for performing the P.C. board layout of the design. The schematic capture process then transmits a plotted-paper-schematic message to the soft-tools process.

The soft-tools process uses this message to create files that contain information to drive manufacturing machine 20. These files are transmitted to the manufacturing-machine process which is the final process in system 10. The simulation is complete when these files are transferred.

During the execution sequence described above, each message that is generated and transmitted by one of the process objects is stored along with other information described below as a working memory element in a frame in database memory 42. This information collected during the simulation is the database from which the analysis of the information flows is based.

The structure and content of the working memory elements generated as a result of the execution of the model is set forth in FIGS. 6A–6B. To fully describe the structure and content, an exemplary working memory element from FIG. 6A is set forth below.

```
{{DESIGN-NAME.SAV-2                          (1)
    INSTANCE: DESIGN-NAME.SAV                (2)
    TIME: 1.0                                (3)
    SENDER: DESIGN-ENGINEER                  (4)
    RECEIVER: LOGIC-SIMULATION               (5)
    CATEGORY: PART LOGIC-CONNECTIVITY        (6)
    UNIQUE-ID: UNIQUE-ID-1                   (7)
    BOARD-COMPLEXITY: 1                      (8)
    DEC-NUMBER: DEC-NUMBER-1                 (9)
    DESIGN-NUMBER: DESIGN-NUMBER-1))         (10)
```

Line (1) identifies this instance of this message-type, DESIGN-NAME.SAV by giving it a unique name. Line (2) indicates the type of message contained in this working memory element. Line (3) is the time stamp that indicates the time on the simulation clock that this message was created. Line (4) identifies the process object that created the message and line (5) identifies the process object that received the message. Line (6) provides a list of data categories contained in the message. Lines (7)–(10) are the specific data and data values included in the message.

The analysis of the information flows of system 10 is performed after the simulation of the information flow within information exchange system 10 has been performed and each message created, transmitted and received by each workstep has been stored in database memory 42.

The present invention utilizes a set of production rules that are applied to the message database to analyze the information flow within information exchange system 10. The rules are used to encode empirical associations between patterns of data presented to a system and actions that the system should perform as a consequence.

The exemplary production rules for analyzing information exchange system 10 to identify concurrent data paths are set forth below. For this example, "Data Categories" is the data group that is being tracked. Examples of data categories can be found by referring to the working memory elements listed in FIGS. 6A–6B. Such examples are part information, board information, solder information. To insure an accurate analysis, data categories are created to group together similar data elements that may have been given different names by the various processes.

Before discussing the rules in detail, the purpose of each rule will be briefly discussed. The execution of rule 1, illustrated below, by rule interpreter 38 results in the scanning of the working memory elements in FIGS. 5A–5B for working memory elements that contain the specified data category. When such working memory element is found, the results of the match are printed to a screen for viewing by the user running the analysis. In addition to this, rule 1 creates a new working memory element to record the match. This working memory element is used by rules 2 and 3.

Rule 2 disables rule 1 when it ascertains that rule 1 has scanned all of the working memory elements. This prevent rule 1 from running continuously.

Rule 3 is the rule which identifies alternative data paths. The purpose of the rule is to identify processes that use the selected data category that could receive the information embodied in the data category earlier.

Rule 3 accomplishes this by scanning the working memory elements created by rule 1 when a match was found. The rule scans the time stamps of each working memory element to determine if the data category was available to process sooner than the process actually used the data category. If such incidents are found, the rule informs the user by printing such information to the screen and proposing a new data path.

Set forth below is the software implementation of rule 1 using the rule structure of the OPS5 production system language. For a complete description of OPS5, reference should be made to Brownston et al., *Programming Expert Systems in OPS5*, (Addison-Wesley Publishing Co., 1985). What follows is the condition side (left side) of rule 1.

```
(p find-data-history-1                                              (1)
    (find-data-history ^ schema-name {<name> not-equal
                                      find-data-history)            (2)
                       ^ category <category>                        (3)
                       ^ types <types>                               (4)
    (message-object ^ schema-name {<name1> not-equal
                                   message-object)                  (5)
                    ^ instance not-equal nil                         (6)
                    ^ receiver <receiver1>                           (7)
                    ^ time <time1>                                   (8)
                    ^ category (intersection <category>
                                not-equal)                           (9)
                    ^ sender <sender1>                              (10)
                    ^ type {<type1> (not-member not-equal
                            <types>)})                              (11)
    -(message-object ^ schema-name {<name1> not-equal
                                    message-object)                 (12)
                     ^ instance not-equal nil                       (13)
                     ^ time less-than <time1>                       (14)
                     ^ category (intersection <category>
                                 not-equal)                         (15)
                     ^ type {<type1> (not-member not-equal
                             <types>)})                             (16)
``` memory elements with the same data category in chronological order.

Set forth below is the activation side (right side) of rule 1 that is executed only upon satisfaction of the conditions of the left side of rule 1.

```
-->
    (format *analysis-file* "~%Data ~S was used in file ~S
        process ~S at time ~S" <category> <type1> <receiver1>       (1)
        <time1>)                                                    (2)
    (add-value <name> 'used-by <receiver1>)                         (3)
    (add-value <name> 'types <types1>)                              (4)
    (add-value <name> 'sent-by <sender1>)                           (5)
    (new-value <name> 'found 'true)                                 (6)
    (add-value <name> 'times-of-use <time1>))                       (7)
```

Lines (1)–(4) identify the data category selected by a user. Lines (5)–(11) are the actual condition of Rule 1 which is used to find working memory elements that contain the selected data category. Lines (12)–(16) are the second part of the condition that is invoked if a working memory element satisfied the first condition embodied in lines (5)–(11). This second part insures that the matched working memory is not one that has already been identified and was not created at an earlier time. This provides for the processing of working Lines (1)–(2) accomplish the printing of the working memory element that satisfied, i.e., matched, the left side of Rule 1. The remaining code in lines (3)–(7) create a new working memory element that is representative of the matched working memory element.

The software implementation for rule 2 is set forth below. The following is the left side of rule 2:

```
(p end-data-history-found                                           (1)
    {(start-history ^ schema-name not-equal start-history)          (2)
     <start-history>}                                               (3)
    {(find-data-history ^ schema-name <find-data-hist>              (4)
                        ^ category <category>                       (5)
                        ^ used-by <used-by>                         (6)
                        ^ found true)                               (7)
     <find-data-history>}                                           (8)
    -(message-object ^ schema-name {<name1> not-equal
                                    message-object}                 (9)
                     ^ instance not-equal nil                      (10)
                     ^ type <type1>                                (11)
                     ^ time <time1>                                (12)
                     ^ sender <sender1>                            (13)
                     ^ category (intersection not-equal <category>) (14)
                     ^ receiver {<receiver1>                       (15)
                         (not-member not-equal <used-by>)})        (16)
```

As stated above, rule 2 determines when Rule 1 has scanned all the working memory elements and then enables rule 3 to start executing. Lines (1)–(3) represent a condition that determines that rule 1 is active. Lines (4)–(8) are a condition that determines if rule 1 has actually found some matches. Lines (9)–(16) represent a condition which ascertains if rule 1 has scanned all the existing working memory elements stored in database memory 42.

Set forth below is the software implementation for the activation side of rule 2.

```
-->
    (ops::remove <find-data-history>)
    (ops::remove <start-history>)
    (make start-history))
```

When the left side of rule 2 is satisfied, the foregoing code is executed. This causes rule 1 to stop searching for the requested data category and also creates a new working memory element which starts the execution of rule 3. At this point, rule 1 can be restarted by a new request by the user.

The software implementation for the left side of rule 3 is set forth below. This rule will identify concurrent data paths and suggest alternatives to enhance the information exchange in the system being analyzed.

ments identified by rule 1 to find a process that uses the selected data category. Lines (11)–(16) locate another process which uses the selected data category but received the data category from a different source than the process identified by the code in lines (5)–(10). The process identified by the code in lines (11)–(16) is also checked to insure that it received the data category before the process identified by the code in lines (5)–(10) received the data category. Lines (17)–(23) test to insure that no other processes have used the selected data category earlier than the processes identified.

Upon satisfaction of the foregoing conditions, two processes have been identified which use the same data category, receive the data category from different sources at different times and would receive the date category earlier if connected. The right side of the rule would now be ready to be executed. Set forth below is the software implementation of the right side of rule 3.

```
(p find-parallel-data-paths-1                                                      (1)
    {(find-parallel-paths ^ schema-name not-equal find-parallel-paths              (2)
                         ^ category {<category> not-equal nil})                    (3)
     <parallel-paths>)                                                             (4)
    (message-object ^ schema-name {<name1> not-equal
                                  message-object)                                  (5)
                    ^ instance not-equal nil                                       (6)
                    ^ receiver <receiver1>                                         (7)
                    ^ time <time1>                                                 (8)
                    ^ category (intersection <category> not-equal)                 (9)
                    ^ sender <sender1>)                                            (10)
    (message-object ^ schema-name not-equal <name1>                                (11)
                    ^ instance not-equal nil                                       (12)
                    ^ receiver {<receiver2> not-equal <receiver1>}                 (13)
                    ^ time {<time2> less-than <time1>}                             (14)
                    ^ category (intersection <category> not-equal)                 (15)
                    ^ sender {<sender2> not-equal <sender1>})                      (16)
    -(message-object ^ schema-name {<name1> not-equal
                                   message-object}                                 (17)
                    ^ schema-name not-equal <name1>                                (18)
                    ^ instance not-equal nil                                       (19)
                    ^ receiver not-equal <receiver1>                               (20)
                    ^ time less-than <time2>                                       (21)
                    ^ category (intersection <category> not-equal)                 (22)
                    ^ sender not-equal <sender1>)                                  (23)
```

Lines (1)–(4) represent a condition that insures that no alternative parallel paths have been identified between the two processes that are being compared. Lines (5)–(10) represent a condition that scans the working memory ele-

```
-->
    (format *analysis-file* "~%Data ~S was used in process ~S                      (1)
        at time ~S" <category> <receiver1> <time1>)                                (2)
    (format *analysis-file* "~%Data ~S was used in process ~S                      (3)
        at time ~S" <category> <receiver2> <time2>)                                (4)
    (make propose-data-path                                                        (5)
        ^ data-name <category>                                                     (6)
        ^ used-by-process <receiver1>                                              (7)
        ^ original-time-received <time1>                                           (8)
        ^ original-sender <sender1>                                                (9)
        ^ new-time-received <time2>                                                (10)
        ^ new-sender <sender2>)                                                    (11)
    (ops::remove <parallel-paths>))                                                (12)
```

The execution of lines (1)–(4) causes the results of the left side of the rule to be printed to the screen for the user. Lines (5)–(12) cause a working memory element representative of the matched process to be created to prevent rule 3 from analyzing the same processes (see lines (1)–(3) of the right side of rule 3).

Using rules 1–3 to provide the framework, and using the working memory elements stored in database memory 42 to provide the data for analysis, the following illustrates an example of an analysis utilizing the present invention.

Initially, a data category must be selected to be the subject of the analysis. A user could input this information using a keyboard which is part of a video display terminal coupled to the computer system 30. The input could be solicited in response to a simple prompt message, e.g., "Please enter Data Category ___". The data category entered by the user would be part of a new working memory element 'Find-data-history'.

For this example, the selected data category will be ARTWORK. Set forth below is the structure of the working memory element created.

```
{{   find-data-history
        schema-name:    find-data-history-1
        category:       ARTWORK
        types:          NIL}}
```

To begin the analysis, rule interpreter 38 accesses production memory 40 to start executing rule 1. To execute this rule, rule intrepreter 38 scans the working memory elements stored in database memory 42 (illustrated in FIGS. 6A–6B) to try to find a working memory element that contains the data category ARTWORK and satisfies the other conditions of rule 1 by trying to replace the variables with information stored in the working memory elements.

The first working memory found by rule interpreter 38 that satisfies rule 1 is entitled "GOOD-SIMULATION-3" (shown in FIG. 5A). Illustrated below is the second part of the rule with the appropriate entries from GOOD-SIMULATION-3 substituted for the variables in rule 1 to illustrate the matching process.

```
(message-object ^ schema-name {GOOD-STIMULATION-3 not-equal
                                   message-object)
                ^ instance not-equal nil
                ^ receiver DESIGN-ENGINEER
                ^ time 21.0
                ^ category ARTWORK PARTS (intersection ARTWORK not-equal
                NIL)
                ^ sender LOCIC-SIMULATION
                ^ type {GOOD-SIMULATION (not-member not-equal <types>)})
```

Rule interpreter 38 then attempts to satisfy the third condition of the rule. Since there are no working memory elements in database memory 42 that receive data category ARTWORK earlier, GOOD-SIMULATION-3 satisfies rule 1. Thus, rule interpreter 38 executes the right side of rule 1 by printing a message indicating the results and generating the following control working memory element.

```
{{   find-data-history
        schema-name:    find-data-history-1
        category:       ARTWORK
        types:          GOOD-SIMULATION
        used-by         DESIGN-ENGINEER
        sent-by         LOGIC-SIMULATION
        found:          true
        times-of-use:   21.0
}}
```

This control working memory element is updated each time rule 1 is satisfied.

Rule interpreter 38 continues to scan the working memory elements stored in database memory 42 to try to satisfy rule 1. Two more working memory elements, ARTWORK-FILES-6 and ON-LINE-DRILL-TOOLS-14 are identified as satisfying rule 1. Upon satisfaction of the left side of rule 1, the right side of the rule is executed which results in the printing of a message that indicates the results and the updating of the control working memory element. Upon locating ARTWORK-FILES-6, the control working memory element is updated as follows:

```
{{   find-data history
        schema-name:    find-data-history-1
        category:       ARTWORK
        types:          GOOD-SIMULATION
        used-by         MANUFACTURING-MACHINE DESIGN-ENGINEER
        sent-by         SOFT-TOOLS LOGIC-SIMULATION
        found:          true
        times-of-use:   78.0 21.0
}}
```

When rule 1 is satisfied again by locating ON-LINE-DRILL-TOOLS-14, the control working memory element is updated as follows:

```
{{  find-data-history
         schema-name:    find-data-history-1
         category:       ARTWORK
         types:          ON-LINE-DRILL-TOOLS ARTWORK-FILES GOOD-
                         SIMULATION
         used by:        MANUFACTURING-MACHINE MANUFACTURING-MACHINE
                         DESIGN-ENGINEER
         sent-by:        SOFT-TOOLS SOFT-TOOLS LOGIC-STIMULATION
         found:          true
         times-of-use:   78.0 78.0 21.0
}}
```

While rule interpreter 38 is scanning database memory 42 to try to find matches to satisfy rule 1, it is also executing rule 2 in the background. Rule 2 is a control rule that determines when there are no more instances of the selected data category that have not already been utilized to satisfy rule 1. Upon determining that no more instances exist, rule 2 is activated to stop the processing of rule 1.

Once rule 1 has stopped searching for the requested data category, rule 3 is initiated to complete the analysis for identifying parallel data paths. The first condition of the rule as discussed above, identifies that a parallel path may be found for the data category ARTWORK. Rule interpreter 38 continues attempting to satisfy rule 3 by scanning the working memory elements stored in database memory 42 (illustrated in FIGS. 6A–6B). The second condition is satisfied by the working memory element ARTWORK-FILES-6 as follows:

```
(message-object ^ schema-name {ARTWORK-FILES-6 not-equal
                              message object}
                ^ instance ARTWORK-FILES not equal nil
                ^ receiver MANUFACTURING-MACHINE
                ^ time 78.0
                ^ category (intersection ARTWORK not-equal NIL)
                ^ sender SOFT-TOOLS
```

The third condition is satisfied by the working memory element GOOD-SIMULATION-3 as follows:

```
(message-object ^ schema-name GOOD-SIMULATION-3 not-equal ARTWORK-
                              FILES-6
                ^ instance not-equal nil
                ^ receiver {DESIGN-ENGINEER not-equal MANUFACTURING-
                              MACHINE}
                ^ time {21.0 less-than 78.0}
                ^ category ARTWORK PART (intersection ARTWORK not-equal
                              NIL)
                ^ sender {LOGIC-SIMULATION not-equal SOFT-TOOLS})
```

Rule interpreter 38 continues to scan the working memory elements to ascertain if any satisfy the fourth condition of rule 3. Since there are none that can provide the data category ARTWORK earlier, the left side of rule 3 is satisfied. Thus, the optimum path is found.

The right hand side of the rule is then executed by first printing the findings to the screen and then creating the following working memory element.

```
{{  PROPOSE-DATA-PATH-1
         data-name:              ARTWORK
         used-by-process:        MANUFACTURING-MACHINE
         original-time-received: 78.0
         original-sender:        SOFT-TOOLS
         new-time-received:      21.0
         new-sender:             LOGIC-SIMULATION}}
```

This working element indicates the results of the analysis that a proposed data path has been identified.

By sending the data category ARTWORK to manufacturing machine 20 from logic simulation 14 instead of soft tools 18, a savings of 57 time units can be realized.

This process of identifying possible parallel paths for optimized performance is only viable for process steps that occur later in information exchange system 10 because the initial process steps cannot be compressed much since such information flows are direct. Also, the analysis is only performed on the critical paths. This is because optimizing processes not on the critical path will not reduce processing time. Information passed on noncritical paths, however, is still included in the analysis to identify possible sources of data. For example, a file created by a process not on the critical path may contain a data element that a process on the critical path could use earlier thereby reducing processing time. Thus, messages created by work steps not on the critical path are evaluated to determine the dependencies of the work steps on the critical path.

In addition to identifying parallel data paths, the present invention is also capable of identifying unused data categories. By identifying such categories, the present invention further optimizes the performance of information exchange system 10 by suggesting the elimination of such data categories.

Illustrated below is an example of a rule, e.g., rule 4, using OP55 rule structure that can identify unused data categories.

```
(p find-unused-data                                                  (1)
    (used-data ^ schema-name {<sname> not-equal used-data)           (2)
    ^ is-a not-equal ( ))
    -(used-data ^ schema-name not-equal used-data ^ instance         (3)
    not-equal ( ) ^ data-type <sname>                                (4)
-->
    (format t "~%Data type ~S was not used in the model ~%"          (5)
    <sname>)
    (format *analysis-file* "~%Data type ~S was not used in          (6)
    the model"<sname>)
    (cschema    (concat 'unused-<sname>)                             (7)
                ('instance 'unused-data-fields)                      (8)
                ('data-field-name <sname>)))                         (9)
```

Lines (1)–(2) are the first condition of rule 4 that identify all data categories that are created. Lines (3)–(4) are satisfied if no processes are found to use the data category identified in lines (1)–(2). Upon satisfying these two conditions, the left side of rule 4 is satisfied. Lines (5)–(6) print the information relevant to the unused data category identified. Lines (7)–(9) create a working memory element that contains the result of the analysis.

Before rule 4 can be executed, a "set-up" rule must be executed by rule interpreter 38. This set-up rule will scan all of the data categories in each working memory element stored in database memory 42 and create new working memory elements that contain information about every data category in each file. An example of such rule is set forth below.

```
(p create-wimmies-for-categories                                     (1)
    (file ^ schema-name {<fname> not-equal file}                     (2)
        ^ categories <selected-category> (one-of<>)                  (3)
        ^ usage-slots <selected-usage-slots>                         (4)
            (corresponding-to<selected-
            category><>)                                             (5)
        ^ time <time-used>)                                          (6)
-(data-category ^ schema-name not-equal data-category                (7)
        ^ instance not-equal ( )                                     (8)
        ^ data-category <selected-category>)                         (9)
        ^ time-used <time-used>)                                    (10)
        ^ usage-slot<> <selected-usage-slots>))                     (11)
-->
    (cschema (concat 'data-category *counter*)                      (12)
        ('instance 'data-category)                                  (13)
        ('data-category (car <list-of-categories>))                 (14)
        ('time-used <time-used>)                                    (15)
        ('usage-slot <selected-usage-slot))                         (16)
    )
```

Line (1)–(6) selects, using the function "one-of", a data category in a file. It also picks up the corresponding usage slot from the file using the function "corresponding-to". Lines (7)–(11) insure that there are no working memory elements already created for this data category. The right side of the rule, lines (12)–(16) create a working memory element for the given data category.

At analysis time, the foregoing set-up rule scans all data categories in each working memory element of FIGS. 6A–6B and creates new working memory elements entitled "data-category" listed in FIG. 7 These new working memory elements contain information about every data category and a slot called "usage-slot" for each category.

Rule 4 will be satisfied if a data category is found where there is only one instance of the data category and there are no other instances of that category. Similarly, if there is a data category for which there are no instances, then it is also identified as unused.

The above described embodiment of the invention is meant to be representative only, as certain changes may be made therein without departing from the clear teachings of the invention. Accordingly, reference should be made to the following claims which alone define the invention.

What is claimed is:

1. A computer implemented method for analyzing information flows in an information exchange system, the information exchange system comprises a plurality of processes intercoupled by a plurality of data paths, comprising the steps of:

(a) developing a model of the information exchange system based upon behavior of the plurality of processes utilizing computer implemented objects to respectively represent the plurality of processes in the information exchange system being modeled and events that occur in the information exchange system;

(b) simulating the information exchange system being modeled to emulate the information flows by transferring messages between the objects, the messages being representative of information transferred between the plurality of processes in the information exchange system;

(c) storing the messages;

(d) locating stored messages that satisfy preconditions of a plurality of rules; and (e) executing each one of the plurality of rules whose preconditions were satisfied in step (d) to identify optimal data paths for information flows in the information exchange system.

2. The method according to claim 1 wherein the step of developing a model further comprises the steps of:

(a) identifying each one of the plurality of processes;

(b) identifying a plurality of events executed by the plurality of processes;

(c) identifying preconditions for the plurality of events; and (d) identifying information flows resulting from the execution of each one of the plurality of events.

3. The method according to claim 2 wherein the step of simulating the model further comprises the steps of:

(a) ordering the plurality of events pursuant to the order in which they are executed; and (b) simulating the model pursuant to a simulation clock that causes the execution of each one of the plurality of events.

4. The method according to claim 3 wherein the step of storing the messages comprises the step of storing information relating to which one of the plurality of processes created, modified and received each one of the messages, including the time each one of the messages is created and received.

5. A computer implemented method for analyzing information flows in an information exchange system, the information exchange system comprises a plurality of processes intercoupled by a plurality of data paths, comprising the steps of:

(a) developing a model of the information exchange system based upon behavior of the plurality of processes utilizing computer implemented objects to respectively represent the plurality of processes in the information exchange system being modeled and events that occur in the information exchange system;

(b) simulating the information exchange system being modeled to emulate the information flows by transferring messages between the objects, the messages being representative of information transferred between the plurality of processes in the information exchange system;

(c) storing the messages;

(d) locating stored messages that satisfy preconditions of a plurality of rules; and (e) executing each one of the plurality of rules whose preconditions were satisfied in step (d) to identify data paths utilized to transfer the same information to one of the plurality of processes from at least two different ones of the plurality of processes.

6. The method according to claim 5 wherein the information stored in each one of the messages is divided into a plurality of data categories and the step of locating stored messages that satisfy preconditions of a plurality of rules further comprises the steps of:

(a) selecting one of the plurality of data categories transferred between the plurality of processes to be the subject of the evaluation;

(b) scanning the messages to identify the messages that contain the selected data category; and (c) upon locating messages that contain the selected data category, creating a plurality of working memory elements representative of each one of the messages identified in step (b).

7. The method according to claim 6 wherein the step of locating stored messages that satisfy preconditions of a plurality of rules further comprises the steps of:

(a) scanning the plurality of working memory elements to identify a first process that uses the selected data category;

(b) scanning the plurality of working memory elements to identify a second process that uses the selected data category which the second process received from a different process than the first process;

(c) verifying that the second process received the selected data category before the first process; and (d) scanning the plurality of working memory elements to verify that no other process used the selected data category earlier than the first and second processes.

8. A computer implemented method for analyzing information flows in an information exchange system, the information exchange system comprises a plurality of processes intercoupled by a plurality of data paths, comprising the steps of:

(a) developing a model of the information exchange system based upon behavior of the plurality of processes utilizing computer implemented objects to respectively represent the plurality of processes in the information exchange system being modeled and events that occur in the information exchange system;

(b) simulating the information exchange system being modeled to emulate the information flows by transferring messages between the objects, the messages being representative of information transferred between the plurality of processes in the information exchange system;

(c) storing the messages;

(d) locating stored messages that satisfy preconditions of a plurality of rules; and (e) executing each one of the plurality of rules whose preconditions were satisfied in step (d) to identify information created by at least one of the plurality of processes and unused by any other one of the plurality of processes.

9. The method according to claim 8 wherein the information represented by each one of the messages is divided into a plurality of data categories and the step of locating stored messages that satisfy preconditions of a plurality of rules further comprises the steps of:

(a) scanning the data categories in each one of the messages; and (b) creating a plurality of working memory elements that contain information representative of each data category in the messages.

10. The method according to claim 9 wherein the step of locating stored messages that satisfy preconditions of a plurality of rules further comprises the step of scanning the plurality of working memory elements to identify an unused data category.

* * * * *